United States Patent [19]

Funke et al.

[11] Patent Number: 6,051,517

[45] Date of Patent: Apr. 18, 2000

[54] MODIFIED ZEOLITE MEMBRANE

[75] Inventors: Hans H. Funke; Jason W. Klaus; Steven M. George; Andrew W. Ott; John L. Falconer; Richard D. Noble, all of Boulder, Colo.

[73] Assignee: University Technology Corp., Boulder, Calif.

[21] Appl. No.: 09/236,891

[22] Filed: Jan. 26, 1999

Related U.S. Application Data

[62] Division of application No. 08/786,675, Jan. 21, 1997.
[51] Int. Cl.[7] .............................. B01J 20/28; B01J 29/04; B01J 29/06; C01G 17/00; C01G 9/00
[52] U.S. Cl. ................................ 502/4; 502/60; 502/63; 502/64; 423/89; 423/99; 423/111; 423/118.1; 95/45; 210/510.1; 210/650
[58] Field of Search .................... 502/4, 60, 63, 502/64; 423/89, 99, 111, 118.1; 95/45; 210/650

[56] References Cited

U.S. PATENT DOCUMENTS

| | | | |
|---|---|---|---|
| 3,837,500 | 9/1974 | Nicolas et al. | 436/63 |
| 4,699,892 | 10/1987 | Suzuki | 502/4 |
| 5,019,263 | 5/1991 | Haag et al. | 210/500.25 |
| 5,100,596 | 3/1992 | Haag et al. | 264/42 |
| 5,258,339 | 11/1993 | Ma et al. | 502/4 |
| 5,429,743 | 7/1995 | Geus et al. | 210/490 |
| 5,464,798 | 11/1995 | Jia et al. | 502/64 |
| 5,468,699 | 11/1995 | Zhang et al. | 502/60 |
| 5,567,664 | 10/1996 | Barri et al. | 502/4 |
| 5,753,121 | 5/1998 | Geus et al. | 210/490 |
| 5,824,617 | 10/1998 | Lai | 502/4 |

OTHER PUBLICATIONS

"Separation of Hydrocarbon Isomer Vapors with Silicalite Zeolite Membranes," Funke, Kovalchick, Falconer, and Noble, *Ind. Eng. Chem. Res.*, 35:1575–1582 (1996).

"Permeation of Aromatic Hydrocarbon Vapors Through Silicalite—Zeolite Membranes," Baertsch, Funke, Falconer, and Noble, *J. Phys. Chem.*, 100:7676–7679 (1996).

"Atomic Layer Growth of $SiO_2$ on Si(100) Using $SiCl_4$ and $H_2O$ in a Binary Reaction Sequence," Sneh, Wise, Ott, Okada, and George, *Surface Science*, 334:135–152 (1995).

"A Defect—Free Mordenite Membrane Synthesized by Vapour–Phase Transport Method," Nishiyama, Ueyama, and Matsukata, *J. Chem. Soc., Chem. Commun.*, 1967–1968 (1995).

"Preparation of Zeolite ZSM–5 Membranes by In–Situ Crystallization on Porous $\alpha-Al_2O_3$," Yan, Davis, and Gavalas, *Ind. Eng. Chem. Res.*, 34:1652–1661 (1995).

"Improvement of the Pervaporation Performance of Silicalite Membranes by Modification With a Silane Coupling Reagent," Sano, Hasegawa, Ejiri, Kawakami, and Yanagishita, *Elsevier Science B.V., Microporous Materials*, 5:179–184 (1995).

(List continued on next page.)

*Primary Examiner*—Gary P. Straub
*Assistant Examiner*—Cam N. Nguyen
*Attorney, Agent, or Firm*—Chrisman Bynum & Johnson; James R. Young

[57] ABSTRACT

A modified zeolite or molecular sieve membrane for separation of materials on a molecular scale. The modified membrane is fabricated to wholly or partially block regions between zeolite crystals to inhibit transfer of larger molecules through the membrane, but without blocking or substantially inhibiting transfer of small molecules through pores in the crystalline structure. The modified membrane has a monomolecular layer deposited on the zeolite surface which has coordinated groups of atoms that include (i) a metal atom bonded to oxygen atoms that are bonded to the zeolite substrate atoms (e.g., silicon atoms) and (ii) either hydroxyl groups bonded to the metal atoms or additional oxygen atoms bonded to the metal atoms.

18 Claims, 6 Drawing Sheets

OTHER PUBLICATIONS

"Zeolite ZSM–5 Membranes Grown on Porous $\alpha$–$Al_2O_3$," Yan, Tsapatsis, Gavalas, and Davis, *J. Chem. Soc., Chem. Commun.*, 227–228 (1995).

"Zeolite–in–Metal Membranes: Preparation and Testing," Kölsch, Venzke, Noack, Toussaint, and Caro, *J. Chem. Soc., Chem. Commun.*, 2491–2492 (1994).

"Potentials of Silicalite Membranes for the Separation of Alcohol/Water Mixtures," Sano, Hasegawa, Kawakami, Kiyozumi, Yanagishita, Kitamoto, and Mizukami, *Studies in Surface Science and Catalysis, Elsevier Science B.V.*, 84:1175–1182 (1994).

"Formation and Characterization of Zeolite Membranes from Sols," Xiang and Ma, Third International Conference on Inorganic Membranes, Worcester, MA, Ju. 10–14, 1994.

"Surface Chemistry of $Al_2O_3$ Deposition Using $Al(CH_3)_3$ and $H_2O$ in a Binary Reaction Sequence," Dillon, Ott, George, and Way, *Surface Science, Elsevier Science B.V.*, 1–13 (1994).

"Single and Multi–Component Transport Through Metal–Supported MFI Zeolite Membranes," Bakker, Zheng, Kapteijn, Makkee, Moulijn, *Precision Process Technology*, 425–436 (1993).

"Ceramic–Zeolite Composite Membranes and Their Application for Separation of Vapor/Gas Mixtures," Jia, Chen, Noble, and Falconer, *Journal of Membrane Science*, 90:1–10 (1994).

"Doorbraak in ontwikkeling zeolietmembranen," Bakker, Kapteijn, Jansen, Bekkum, and Moulijn, *Proces Technologie*, 7–16, (Dec. 1993).

"Synthesis and Characterization of a Pure Zeolitic Membrane," Tsikoyiannis and Haag, *Zeolites*, 12:126–130 (1992).

"High–Temperature Stainless Steel Supported Zeolite (MFI) Membranes: Preparation, Module Construction, and Permeation Experiments," Geus, van Bekkum, Bakker, and Moulijn, *Microporous Materials*, 1:131–147 (1993).

"Porous Crystal Membranes," Barrer, *J. Chem. Soc. Faraday Trans.*, 86(7):1123–1130 (1990).

"Fine Control of the Pore–Opening Size of Zeolite ZSM–5 by Chemical Vapor Deposition of Silicon Methoxide," Niwa, Kato, Hattori, and Murakami, *J. Phys. Chem.*, 90:6233–6237 (1986).

"Fine Control of the Pore–Opening Size of Zeolite Mordenite by Chemical Vapour Deposition of Silicon Alkoxide," Niwa, Kato, Hattori, and Murakami, *J. Chem. Soc., Faraday Trans.*, 80:3135–3145 (1984).

"Silicalite, a New Hydrophobic Crystalline Silica Molecular Sieve," Flanigen, Bennett, Grose, Cohen, Patton, and Kirchner, *Nature* vol., 271:512–516 (1978).

MODIFIED ZEOLITE MEMBRANE

CROSS-REFERENCE TO RELATED APPLICATION:

This patent application is a division of co-pending U.S. patent application Ser. No. 08/786,675, filed Jan. 21, 1997, entitled "Modification of Zeolite or Molecular Sieve Membranes Using Atomic Layer Controlled Chemical Vapor Deposition", incorporated herein by this reference in its entirety.

BACKGROUND OF THE INVENTION

1. Field of the Invention

This invention relates to membrane structures for separation of materials on a molecular scale, such as selective sorption, molecular sieving, and the like, and more particularly to modification of such membranes by atomic layer controlled chemical vapor deposition to increase effectiveness of the membrane for materials separation, or other purposes.

2. Description of the Prior Art

Materials, such as gases or liquids, can be separated from other different materials on the molecular level by a number of techniques. Some well-known examples include evaporation and condensation, which is used to distill alcohol, electrolysis, which is used to remove chromium from solution and plate it onto parts, and crystallization, which is used to purify salts, drugs, or other substances from contaminated mixtures or solutions. More relevant to this invention, thin membranes of some solid materials that have very small pores are permeable to certain gases or liquids comprising small molecules, and impermeable to other gases or liquids that may comprise larger molecules, different shaped molecules, molecules with different polarizability, different absorption properties, or combinations of any of these factors. In industrial applications, organic polymer membranes are used, for example, to separate substances such as ethanol from water. Also of interest, some solid materials are adsorbents for certain gases or liquids. Some zeolites, such as 4A, are more adsorbent of molecular nitrogen ($N_2$) than of molecular oxygen ($O_2$) at increasing pressures and desorb the nitrogen when pressure is decreased. This adsorption/desorption cycle is used in combination with reversing flow directions to separate nitrogen gas ($N_2$) from oxygen ($O_2$) in air.

Recognizing how such molecular separation materials and mechanisms work, it is, of course, desirable to improve them to make them more effective and more efficient for their material separation functions. For example, in the U.S. Pat. No. 3,837,500, issued to Nichols et al., a process is described for reticulating or cross-linking an organic porous polymer membrane comprising ultrathin layers of polyvinyl alcohol and polyvinyl pyrrolidone with diisocynate reticulation agent to decrease and control the pore size of the membrane for more effective water/salt separation.

Zeolites are microporous crystalline alumina silicates with a narrow distribution of pore sizes on a molecular scale, and they have high thermal, chemical, and mechanical stabilities. Molecular sieves can be, for example, alumina phosphates (ALPO) or silicaaluminaphosphates (SAPO), which are also microporous, crystalline materials with a narrow distribution of pore sizes and also have high thermal, chemical, and mechanical stabilities. Therefore, zeolites and molecular sieves can be used not only for gas separations in adsorption/desorption processes, as mentioned above, but also as diffusion membranes when prepared in thin film form. The size and adsorption properties of the zeolite pores, however, limit what can be separated with a particular type of zeolite membrane, even if the crystalline structure is perfect and defect free. However, perfect and defect free zeolite crystalline structures are not readily available or easy to prepare, so most zeolite materials have defects and separations or spaces between crystals, which can be larger than the pore sizes in the crystalline structures. Therefore, transport of molecules by diffusion can take place both within the zeolite crystals and between adjacent crystal faces. Since the spaces between adjacent crystal faces can be larger than the pores in the zeolite crystals themselves, it is very difficult to produce zeolite membrane types with good separation capabilities, and only a few have been prepared prior to this invention.

There is a substantial need for better and different zeolite membranes. For example, the sequential adsorption/desorption pressure swing cycles mentioned above for separating gases require a high capital investment for any significant volume production in industrial plants, and such systems have high maintenance costs. A gas separation system that takes advantage of both the adsorption and diffusion properties of zeolites, but operates at steady state rather than pressure cycling would be much more efficient, but such a system would require good, effective, and efficient continuous zeolite membranes.

In recent years, thin, dense layers of zeolites have been prepared both in self-supporting thin film membrane structures and on macroporous substrates or supports. See, for example: W. J. W. Bakker et al., "Single and Multi-Component Transport Through Metal Supported MFI Zeolite Membranes," *Precision Process Technology*, Eds. M. P. C. Weiznen and A. A. H. Drinkenburg, Lluwer Academic Publishers, 1993, page 425; W. J. F. Bakker et al., "Doorbreak in Ontwikkeling Zeolietmembranen, in Dutch (English translation of title: Break-Through in Development of Zeolite Membranes," *Proces Technologies*, Vol. 3, December 1993, page 7; M. Jia et al., "Ceramic-Zeolite Composite Membranes and Their Application for Separation of Vapor/Gas Mixtures," *J. Membr. Sci.*, Vol. 90, 1994, page 1; Y. Yan et al., "Zeolite ZSM-5 membranes grown on porous $\alpha$-$Al_2O_3$," *J. Chem Soc. Chem. Commun.*, 1995, page 227; T. Sano et al., "Potentials of Silicalite Membranes for Separation of Alcohol/Water Mixtures," *Studies in Surface Science and Catalysis*, 1994, vol. 84, page 1175; J. Tsikoyiannis et al., "Synthesis and characterization of a pure zeolite membrane," *Zeolites*, February 1992, vol. 12, page 126; E. Wu et al., "Hydrocarbon adsorption characterization of some high silica zeolites," *Studies in Surface Science and Catalysis*, 1986, vol. 28, page 547; and S. Xiang et al., "Formation and characterization of zeolite membranes from sols," 3rd International Conference on Inorganic Membranes, Worcester, Mass., Jul. 10–14, 1994. Hydrothermal synthesis with aqueous solutions of zeolite precursors is the most widely used method to form the membrane layer. See, for example: M. Jia et al., supra,; T. Sano, supra; E. Geus et al., "High temperature stainless steel supported zeolite (MFI) membranes: preparation, module construction, and permeation experiments," *Microporous Materials*, 1993, vol. 1, page 131; Y. Yan et al., "Preparation of zeolite ZSM-5 membranes by in-situ crystallization of porous $\alpha$-$Al_2O_3$, *Ind. Eng. Chem. Res.*, 1995, vol. 34, pages 1652–1661; Y. Yan et al., "Zeolite ZSM-5 Membranes Grown on Porous $\alpha$-$Al_2O_3$," *J Chem. Soc., Chem. Commun.*, 1995, pages 227–228. Other techniques for forming zeolite membranes may include: (i) treating a dry layer of zeolite precursors in steam, N. Nishiyama et al., "A defect-free mordenite membrane synthesized by vapor phase transport method," *J. Chem Soc. Chem. Commun.,* 1995, page 1967; (ii) embedding zeolite crystal in a metal matrix, P. Kolsch et al., "Zeolite-in-metal membranes: Preparation and testing," *J. Chem. Soc. Chem. Commun.,* 1994, vol. 21, page 2491; and (iii) sintering zeolite crystals to form a dense layer, C. Engelen et al., "Membrane for separation of small molecules and its manufacture," PCT Int. Appl. WO 93/19841, 1993, to ECN. Such zeolite membranes prepared by these processes have shown a good potential for the separation of molecules that have sufficient differences in their respective adsorption and diffusion behavior. Other commercially important separations, such as nitrogen from carbon dioxide ($N_2/CO_2$) or nitrogen from methane ($N_2/CH_4$) have not been obtained with these zeolite membranes, most likely because the $CO_2$ and $CH_4$ molecules are small and can easily enter and permeate through the regions between the zeolite crystals. It is noteworthy that polycrystalline silicalite membranes have been modified with silane coupling reagents to improve pervaporation performance with aqueous ethanol solutions. The modification was performed from the liquid phase with a large alkyltrichlorosilane molecule (alkyl=$C_8H_{17}$, and $C_{18}H_{37}$). The coupling agents were dissolved in an inert solvent. The authors concluded that the change in permeation properties was caused by an altered hydrophobicity of the external membrane surface. See T. Sano et al., "Improvement of the pervaporation performance of silicalite membranes by modification with a silane coupling reagent," *Microporous Materials,* 1995, vol. 5, pages 179–184. However, the coupling agent used were longer molecules that were not able to enter the zeolite pores and may be too large to enter gaps between crystals. Also, diffusion and transport in the fluid phase is different than in the gas or vapor phase, so different membrane regimes should be accessed at different rates.

SUMMARY OF THE INVENTION

Accordingly, it is a general object of this invention to provide a process by which improved molecular sieves and altered membranes can be fabricated for separation of materials in a mixture that have different molecular properties, such as size, shape, or adsorption characteristics.

It is another object of this invention to provide a method by which passages through zeolite or molecular sieve membranes can be reduced in a very controlled and effective manner for improved material separation effectiveness from mixtures.

Still another object of the present invention is to decrease pore sizes in zeolite or molecular sieve membranes.

A more specific object of this invention is to provide a method for blocking or partially blocking regions between crystals in crystalline membranes or molecular sieves to inhibit transfer of larger molecules through the membranes or molecular sieves, but without substantially inhibiting transfer of small molecules through pores in the crystalline structures.

Another specific object of this invention is to improve zeolite or molecular sieve membranes to effectively separate materials with smaller molecules than has been feasible with some zeolites, such as 4A.

Another specific object of this invention is to provide a process for changing adsorption characteristics of zeolite or molecular sieve membranes.

Another more specific object of this invention is to block or partially block regions between zeolite crystals in zeolite membranes without blocking or substantially affecting or decreasing effective pore size and molecular transfer through the zeolite crystals.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes and objects of the present invention, as embodied and broadly described herein, the method of modifying membranes according to the present invention includes modifying a zeolite or other crystalline membrane that has surface hydroxyl groups with an atomic layer controlled chemical vapor deposition (ALC-CVD) process or atomic layer controlled chemical liquid deposition (ALC-CLD) process. Both the ALC-CVD process and the ALC-CLD process include (i) exposing the membrane to molecules comprising a metal atom coordinated with ligand groups having bonds that are hydrolyzable and allowing them to react with the surface hydroxyl groups on the zeolite membrane or substrate to form molecular bonded structures on the zeolite surface that comprise the metal atoms coordinated with the ligand group or with a modified ligand group that results from the reaction and bonded to oxygen atoms that are bonded to zeolite substrate atoms (e.g., silicon atoms) and then (ii) hydrolyzing and possibly, but not necessarily, cross-linking the bonds in the ligand or modified ligand group. The resulting monomolecular layer deposited on the zeolite surface has coordinated groups of atoms that include (i) the metal atom bonded to oxygen atoms that are bonded to the zeolite substrate atoms (e.g., silicon atoms) and (ii) either hydroxyl groups bonded to the metal atoms or additional oxygen atoms bonded to the metal atoms. These coordinated groups of atoms that comprise the deposited monomolecular layer modify the surface of the zeolite by reducing effective sizes of defects in substrate crystalline structures as well as of gaps or separations between adjacent crystalline structures that comprise the zeolite membrane while preferably, but not necessarily, modifying substantially the effective pore sizes in and through the zeolite crystals. However, if desired, one or more additional layers can be deposited substantially in the same manner as described above, which will substantially modify and possibly even partially or entirely block the pores in the zeolite crystals.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the Drawings.

DETAILED DESCRIPTION OF THE PREFERRED EMBODIMENTS

Figure 1:
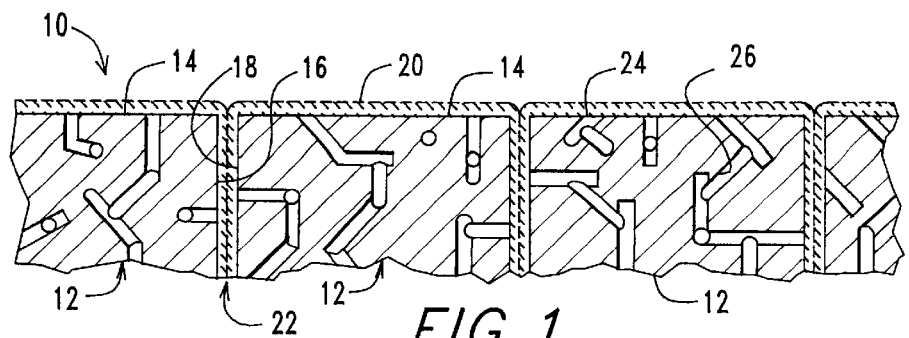
FIG. 1 is an enlarged diagrammatic cross-section of a surface of a crystalline membrane illustrating separate crystal structures separated between juxtaposed faces or surfaces.

An enlarged cross-sectional view of a portion of a crystalline membrane or molecular sieve 10 is illustrated diagrammatically in FIG. 1 with a monomolecular layer 20 deposited or grown on the top surfaces 14 and side surfaces 16, 18 of the crystals 12 to modify the permeability of the membrane or molecular sieve 10 for gases according to this invention in order to improve the capability of the membrane to separate mixtures. For purposes of facilitating the description and explanation of this invention, the illustrations in the drawings are diagrammatic representations of crystalline and molecular structures. They are conceptual representations based on the inventors' understandings and to some extent guesses about the chemical and physical structures, since there are no direct microscopy techniques to provide actual images of the structures involved. Consequently, these diagrammatic representations only facilitate explanations, but are not intended to provide accurate depictions, dimensions, or proportions and, more importantly, are not intended to limit the scope of the invention or of this patent in any way. At the same time, it is important to note that membranes can be and have been modified by the process of this invention, regardless of how the structure actually looks on the atomic scale.

The membrane materials 10 of which this invention is particularly applicable are crystalline substances, such as zeolites, and molecular sieves, such as ALPO's, SAPO's, and MCM41, that are characterized by pores of molecular dimensions and fairly uniform size that have the ability to adsorb and/or pass small molecules but not large ones. Zeolites are one type of such materials and will be used in the exemplary description of this invention, although this invention is not limited to zeolites. Zeolites are naturally occurring and synthetic crystalline substances, composed primarily of silicon, aluminum, and oxygen and often found in nature. They are naturally porous, very uniform crystals 12. Silicalite is a particularly useful zeolite that comprises very uniform, well defined crystal structures of silicon dioxide ($SiO_2$), which can be fabricated into membrane structures.

As illustrated in FIG. 1, the zeolite membrane structures usually comprise a plurality of crystals 12, which, as mentioned above, are porous in the crystal lattice. Small molecules, such as gaseous nitrogen ($N_2$), can enter and pass through the porous crystal lattice, while larger molecules, such sulfur hexafluoride ($SF_6$), can hardly enter or pass through the crystal lattice of the crystals 12. However, there are defects in individual crystals as well as microscopic gaps between individual crystals. For purposes of illustration, the gap or region 22 between the juxtaposed faces 16, 18 of adjacent crystals 12 in FIG. 1 represents diagrammatically such defects and gaps. Such gaps 22 can and do provide conduits through which larger molecules can pass, thus inhibiting the effectiveness of the membrane 10 for separation of larger molecules from smaller molecules.

On a smaller level, even though the size of pore openings 24 in zeolite and molecular sieve crystals 12 of, for example, (MFI) zeolites, such as silicalite or ZSM-5, is comparable in size (ovular 0.51×0.57 nm) to small organic molecules and the pore openings are interconnected by a zig-zag system of straight channels 26 with nearly circular cross-sections of about 0.54 nm diameter, membranes 10 made of such zeolite materials are not effective in such commercially important separations as nitrogen gas from carbon dioxide gas ($N_2/CO_2$) or nitrogen gas from methane gas ($N_2/CH_4$). Apparently, smaller molecules, $CO_2$ and $CH_4$, can enter easily and permeate through the pore channels 26 along with the nitrogen gas molecules.

To alleviate these problems of larger molecules passing through the gaps 22 between crystals 12 and some significant smaller molecules from passing through pore channels 26 in the lattice of the crystals 12, according to this invention one or more layers 20 of additional structures are formed on one or more of the surfaces 14, 16, 18 of the crystals 12 (such layers 20 can also be formed on the bottom or other surfaces, which are not shown), which layers 20 are also porous enough to allow entry and passage of smaller molecules through the crystal lattice, but which otherwise substantially block or clog the regions 22 between the crystals 12 enough to inhibit entry or diffusion of larger molecules into and through such regions 22. Such layer(s) 20 can also decrease the effective size of the pore openings 24 or otherwise affect adsorbent properties of the crystal 12 surfaces to inhibit migration of some smaller or strongly adsorbing molecules through the pore channels 26 in the crystal 12 lattice. Therefore, while the layer(s) 20 cover the top surface 14 as well as other exposed surfaces 16, 18 sufficiently to block or inhibit larger molecules and even some smaller molecules from flowing through the membrane 10, such layer(s) do not substantially inhibit entry of the smallest molecules, such as nitrogen, helium, or hydrogen, into the pores in the crystals 12. To obtain this feature according to this invention, the lattice layer(s) 20 have to be kept very thin—on the order of only a few (1 to 10) angstroms. Even with such thin lattice layer(s) 20, the fluxes do decrease for all molecules, but for some more than others. One plausible explanation for this observation could be that some pores may become totally blocked, although this explanation is not essential to the invention or to the practice of this invention.

Figure 2:
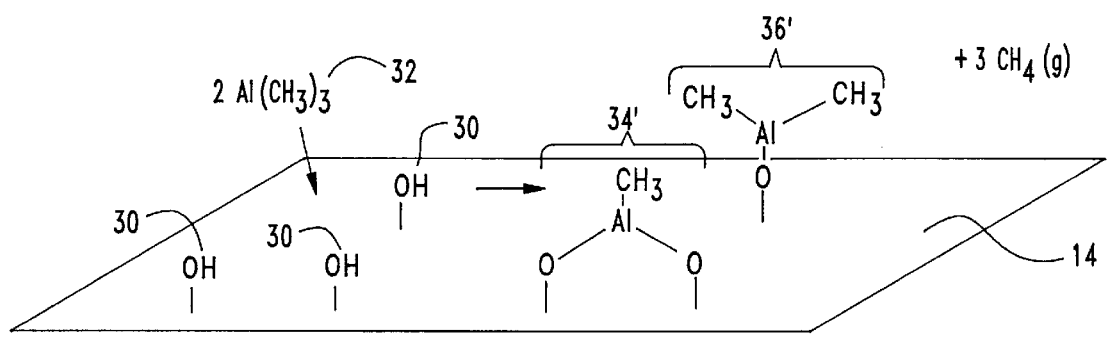
FIG. 2 is a diagrammatic representation and illustration of the hydroxyl (OH) groups or sites on the surface of a material in a specific preferred reaction of the reaction gas $Al(CH_3)_3$ to produce intermediate structures that comprise the reactive atom aluminum (Al) bonded to oxygen atoms remaining from the previous hydroxyl (OH) sites and also bonded to one or more ligand ($CH_3$) groups.
Figure 5:
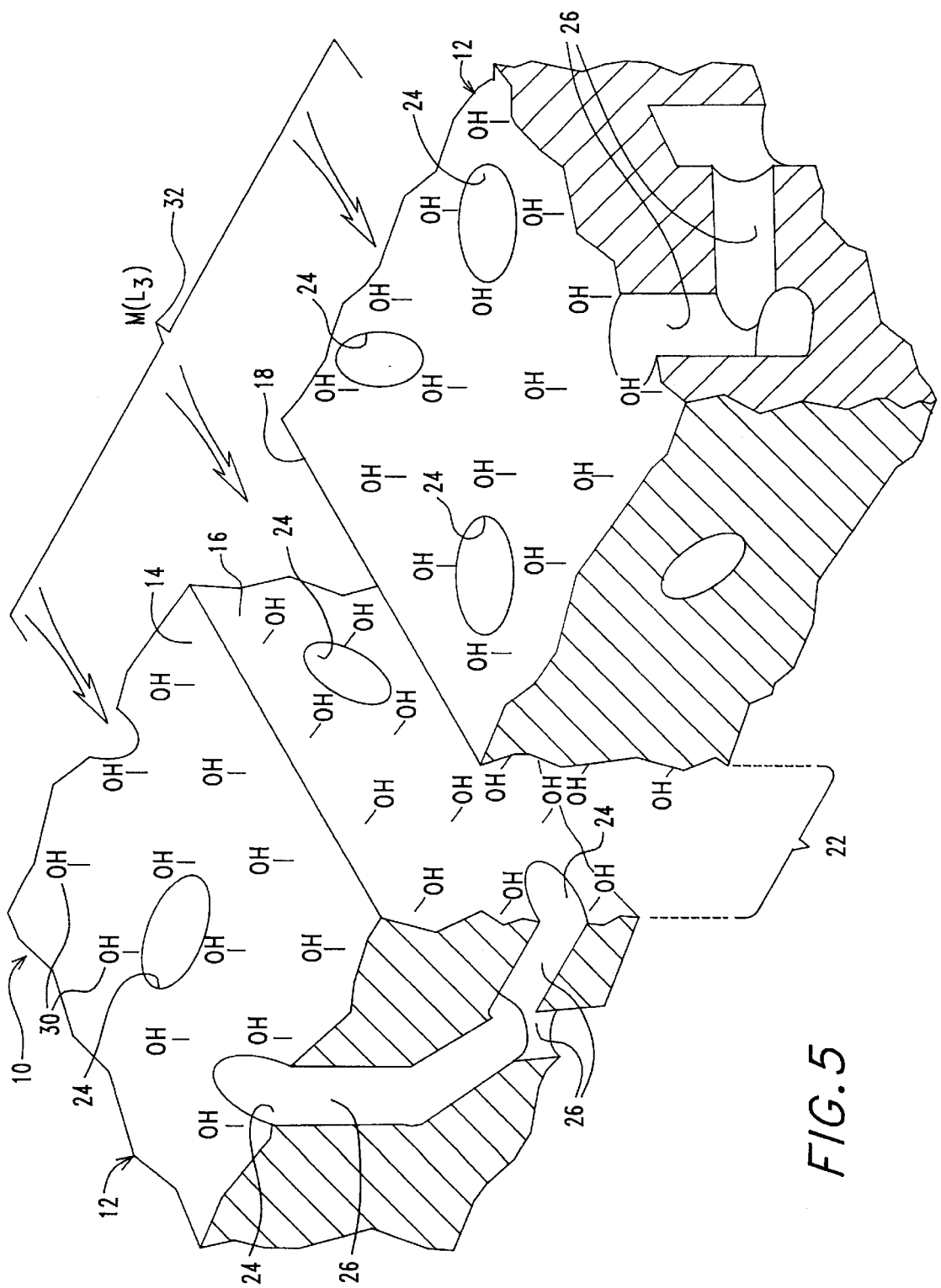
FIG. 5 is an enlarged isometric view of portions of adjacent crystals illustrating diagrammatically in general terms the hydroxyl groups (OH) or sites on the surfaces of the crystals as volatile reaction gas molecules coordinated with ligands ($M(L_3)$) are introduced.

Conventional thin film deposition processes, such as chemical vapor deposition (CVD) and chemical liquid deposition (CLD), are very difficult, if not impossible, to control sufficiently to achieve the surface modifications required for such separations as those discussed above, at least on a predictable and dependable basis. Therefore, according to this invention, atomic layer controlled chemical vapor depositions (ALC-CVD) can be used to modify the surfaces 14, 16, 18 of crystalline membranes 10, such as, for example, but not for limitation, the zeolite crystals 12 illustrated in FIG. 1. ALC-CVD as used in this invention is based on reaction of volatile molecules with hydroxyl (OH) groups 30 on the surfaces 14, 16, 18, which are illustrated in FIGS. 2 and 5, to form O—M bonds, where O is oxygen and M can be any one or more metal atoms, for example, aluminum (Al), silicon (Si), germanium, (Ge), indium, (In), cadmium (Cd), and the like, coordinated with ligands (L), such as a alkyl group ($C_nH_{2n+1}$), chlorine (Cl), alkoxy group (O—$C_nH_{2n+1}$), and the like. Any molecules (i) according to this specification, (ii) that are volatile and reactive enough to react from a gas phase with surface OH-groups, and (iii) that result in an attached layer that has remaining ligands that can be hydrolized with water to form new OH-groups are suitable for purposes of this invention. At least one ligand is necessary if it is desired to form one monomolecular layer and at least two ligands are necessary if it is desired to form two or more monomolecular layers.

Figure 3:
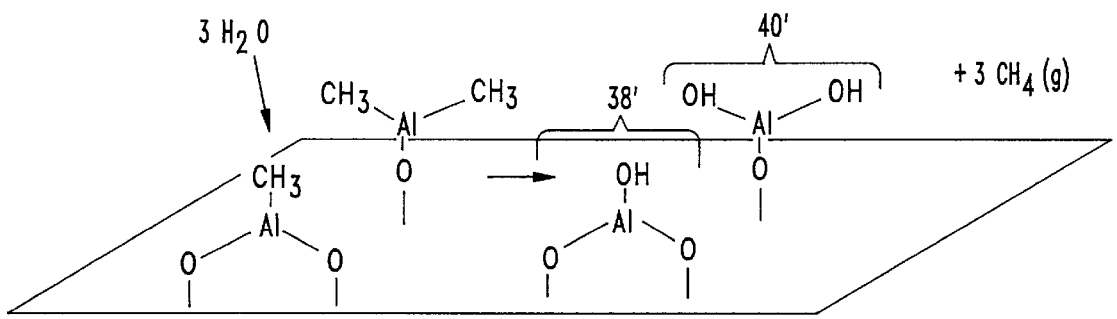
FIG. 3 is a diagrammatic representation and illustration of hydrolyzing the bond between the reactive atom (Al) and the ligand ($CH_3$) to produce monomolecular surface structures as described for FIG. 2, but with each $CH_3$ ligand replaced with a hydroxyl (OH) group.
Figure 4:
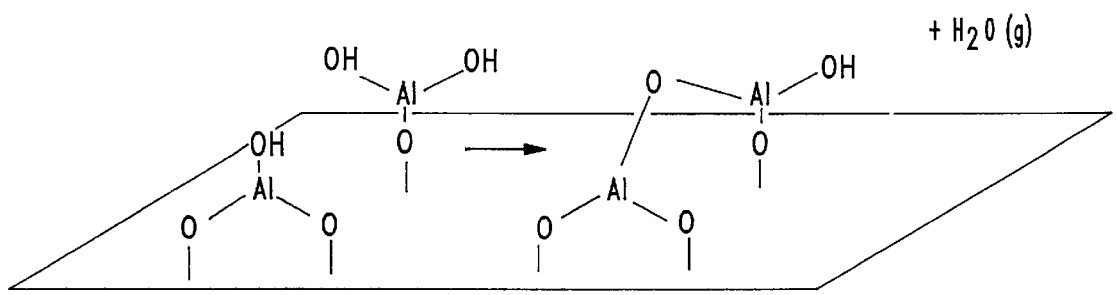
FIG. 4 is a diagrammatic representation and illustration of the monomolecular layer composition after condensing to replace some hydroxyl (OH) groups.

After completion of this first reaction, the resulting M—L bonds (chemical bonds between the reactive atoms M and the ligands L) are hydrolyzed with water ($H_2O$) vapor to form new hydroxyl (OH) groups. The new hydroxyl (OH) groups of adjacent molecular formations can condense to form a cross-linked monomolecular layer. These reaction steps are illustrated and described below in more detail. FIGS. 2–4 illustrate exemplary chemical reactions used according to this invention to modify zeolite membranes 10 in a graphical manner, while FIGS. 5–9 illustrate diagrammatically in more general or generic terms and in three-dimensional views surface molecular layer formation phases according to these atomic layer controlled chemical vapor deposition (ALC-CVD) chemical reactions. While surface modification of zeolite crystal surfaces based on the presence of hydroxyl (OH) groups on the crystal surfaces is illustrated in FIGS. 2–9, other crystalline membranes or molecular sieve materials having surface hydroxyl groups or other reactive groups, such as $NH_2$ and SH, can also be accomplished according to this invention.

Referring now primarily to FIGS. 2 and 5, the top and side surfaces 14, 16, 18, as well as the bottom surface (not shown), of the zeolite crystals 12 have a natural abundance of hydroxyl (OH) group sites 30. Some zeolites, such as those that contain some aluminum (Al) in the crystal 12 lattice, have a high density of surface hydroxyl (OH) groups 30, while others, especially silica-rich zeolites, such as, silicalite, have fewer surface OH-groups 30. Usually, however, even in silica-rich zeolites, there are enough crystal defects that have OH-groups in sufficient numbers and densities to accommodate the above-described chemical reactions required for atomic layer controlled chemical vapor deposition (ALC-CVD) for purposes of this invention.

Figure 6:
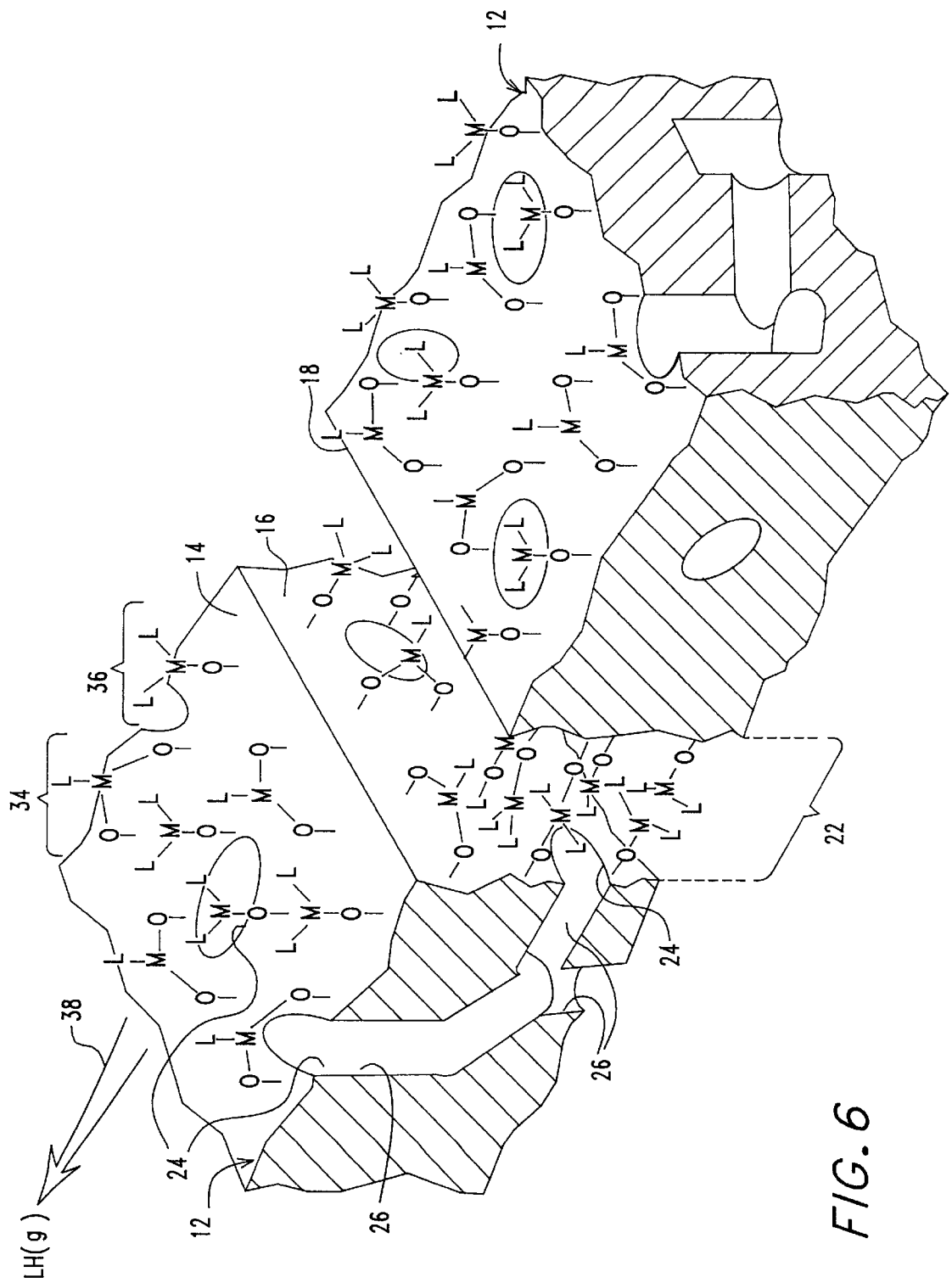
FIG. 6 is an enlarged isometric view of the adjacent crystals of FIG. 5 illustrating in general terms the intermediate molecular structures after reaction with the gas molecules.

In the first step, the volatile, reactive, gaseous compound denoted generically as $M(Z_mL_n)$ (more specifically for simplicity of illustration—$M(L_3)$—in FIG. 5) and with the exemplary compound trimethylaluminum $Al(CH_3)_3$ in FIG. 2 is introduced into a vacuum chamber (not shown) containing the zeolite membrane 10. The volatile $M(Z_mL_n)$ molecules 30 react with the hydroxyl (OH) sites 30 on the exposed surfaces 14, 16, 18 of the zeolite crystals 12 to form O—M bonds that are coordinated with ligands according to the reaction expressed in general terms as:

$$Y-OH^* + M(Z_mL_n) \rightarrow Y-O-M(Z_{m-1}L_n) + ZH\uparrow \quad (1)$$
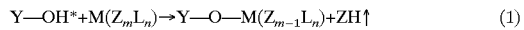

where Y is the substrate material, OH* is the surface hydroxyl site, $M(Z_mL_n)$ is the reaction gas molecule, $M(Z_{m-1}L_n)$ is the resulting coordinated reactive atom and ligand group, and ZH↑ is the gaseous by-product of the reaction as illustrated in FIG. 6 at 38. In general, there can be any number of ligands and any combination of ligands for purposes of this invention. Also, L could be the same ligands as Z, and $Z_mL_n$ can comprise one of a kind ligand or a combination of different ligand types in different numbers. The $Z_m$ ligand can be a combination of different ligands, and $L_n$ can also be a combination of different ligands. The resulting intermediate crystalline structure, as illustrated in FIG. 6, can be, for example, one metal atom (M) bonded to two oxygens (O) and a ligand (L) as illustrated at 34, or one metal atom M bonded to one oxygen(O) and two ligands (L) as illustrated at 36. Of course, instead of just one ligand (L), there could also be any combination of ligands $Z_{m-1}L_n$ as described above and as will be understood by persons skilled in the art. However, these alternatives are not illustrated in FIG. 6, because they would add unnecessarily to the complexity of the drawing without contributing substantially to clarity or the understanding of this invention. The more specific example of this reaction (i), where $Al(CH_3)_3$ is used as the reaction gas to produce O—Al bonds at the hydroxyl (OH) sites is:

$$Si-OH^* + Al(CH_3)_3 \rightarrow Si-O-Al(CH_3)_2 + CH_4\uparrow \quad (2)$$
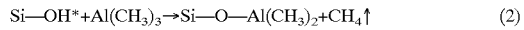

which produces the coordinated group comprising one aluminum Al atom bonded with two oxygen (O) atoms and one $CH_3$ ligand as illustrated at 34' in FIG. 2 or the alternative group comprising one aluminum (Al) atom bonded with one oxygen (O) atom and two $CH_3$ ligands as illustrated at 36' in FIG. 2. The gaseous by-product of this reaction (2) is methane gas ($CH_4$). When all of the hydroxyl (OH) sites are filled, the reaction stops automatically, so it is self-limiting, which makes this process very conducive to use in industrial applications.

Figure 7:
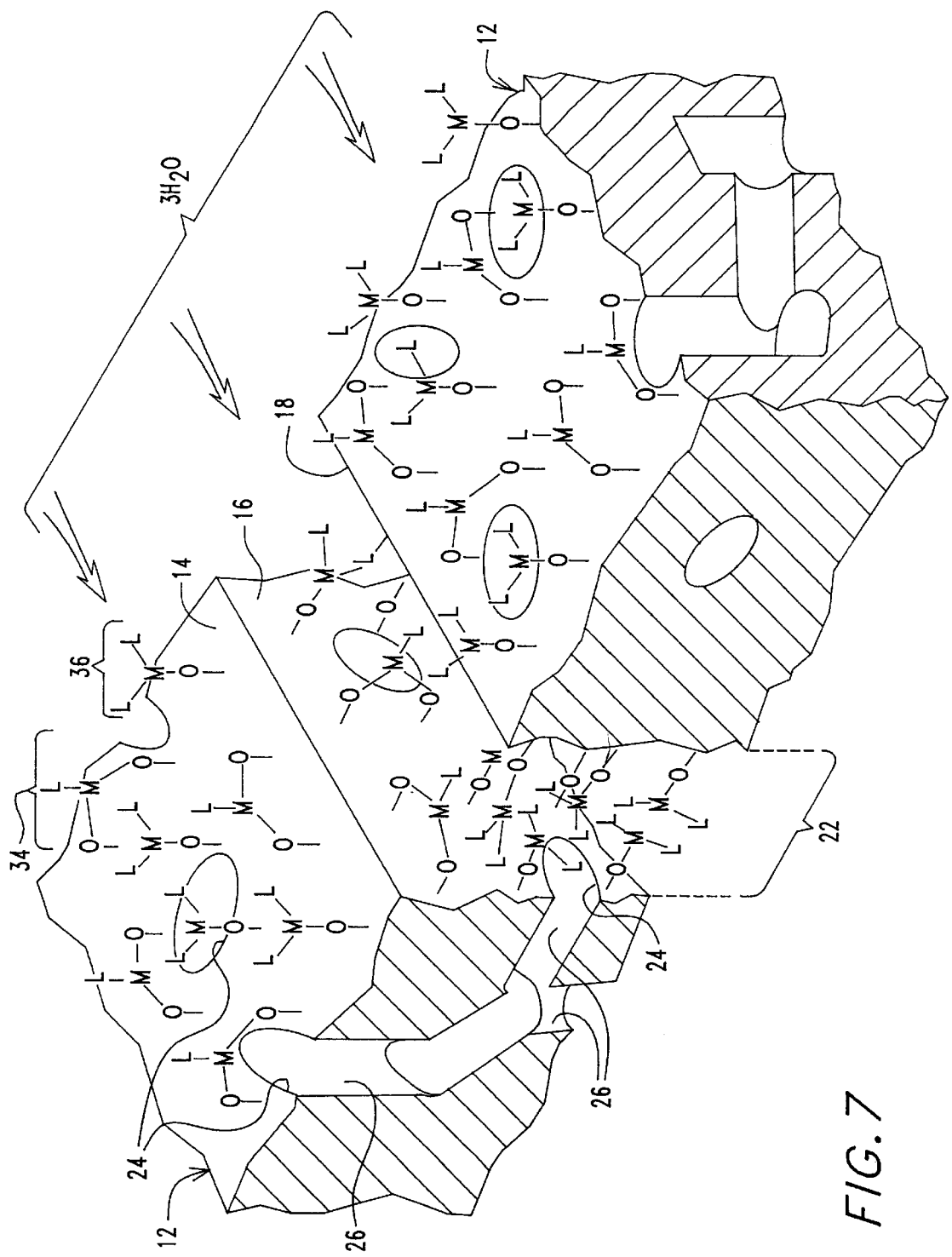
FIG. 7 is an enlarged isometric view of the adjacent crystals of FIG. 6 as the second step of exposing to molecular structures of FIG. 6 to water vapor ($H_2O$) begins.

After the initial reaction (1) or (2) described above, the M-L bonds can be hydrolyzed with water ($H_2O$) vapor, as indicated by FIG. 7, to form hydroxyl (OH) groups in place of the ligands according to the reaction generally expressed as:

$$M(L)^* + H_2O \rightarrow M-OH^* + LH\uparrow \quad (3)$$

The more specific exemplary hydrolyzing reaction is:

$$Al(CH_3)^* + H_2O \rightarrow Al-OH^* + CH_4\uparrow \quad (4)$$
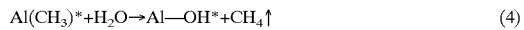

This reaction is also self-limiting. When all of the sites are hydrolyzed and ligands replaced with hydroxyl (OH) groups, as indicated generally in FIG. 8 and for the exemplary reaction in FIG. 3, this reaction also stops. The resulting bonded O—M—OH groups of either one reactive atom M grouped with two oxygen (O) atoms and one hydroxyl (OH) as illustrated at 38 in FIG. 8 or one reactive atom M grouped with one oxygen (O) atom and two hydroxyls (OH) as illustrated at 40 in FIG. 8 form a monomolecular layer 20 on the surfaces 14, 16, 18 of the zeolite crystals 12 as also illustrated in FIG. 1. In the exemplary reaction (4), the resulting bonded groups of one aluminum (Al) atom grouped with two oxygen (O) atoms and one hydroxyl (OH) as illustrated at 38' in FIG. 3 or one aluminum (Al) atom grouped with one oxygen (O) atom and two hydroxyls (OH) as illustrated at 40' in FIG. 3 form the monomolecular layer 20 on the zeolite crystals 12 in FIG. 1.

The gaseous by-product of the exemplary reaction (4) described above is also methane ($CH_4$) as illustrated in FIG. 3.

Figure 8:
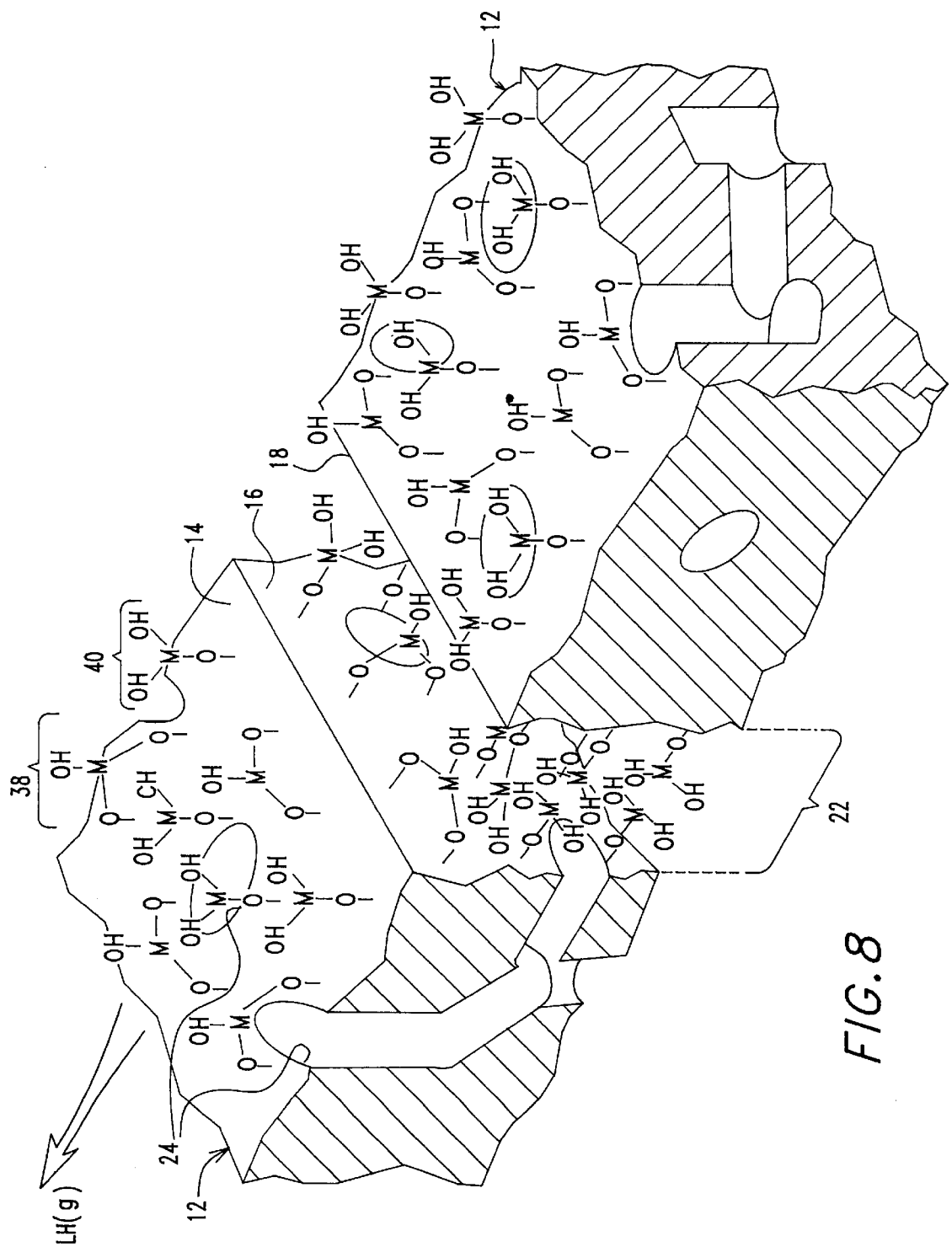
FIG. 8 is an enlarged isometric view of the adjacent crystals of FIG. 7 illustrating in general terms the new hydroxyl groups (OH) formed on the molecular structures of FIG. 7.
Figure 9:
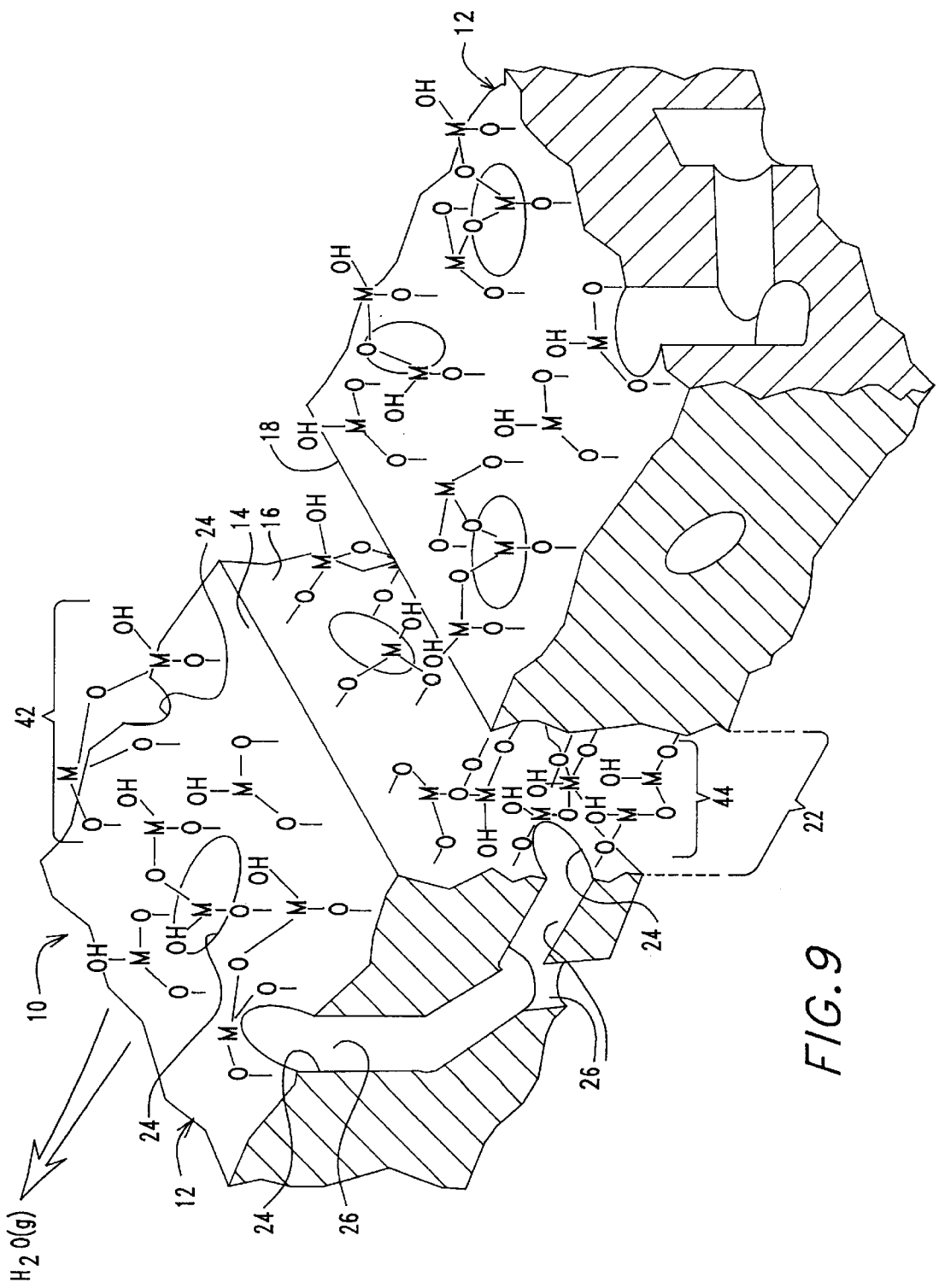
FIG. 9 is an enlarged isometric view of the adjacent crystals of FIG. 8 further modified by condensation to produce continuous, cross-linked monomolecular layers on the surfaces.

The hydroxyl (OH) groups of adjacently deposited molecules, such as those illustrated at 38 and 40 in FIG. 8, can also condense to form a continuous, cross-linked monomolecular layer as illustrated at 42 in FIG. 9. It is possible, although not necessary to this invention, for molecules deposited on very closely spaced juxtaposed surfaces 16, 18 of adjacent crystals 12 or in defects to also cross-link, as illustrated at 44 in FIG. 9. The cross-linked molecular groups of bonded O—Al—O—Al atoms resulting from condensed adjacently deposited molecules in the exemplary reaction is illustrated in FIG. 4. The by-product of such condensation is water ($H_2O$) vapor.

Regardless of whether or how much such condensation actually occurs, however, the resulting O—M—OH or O—M—O groups that form the monomolecular layer 20 on the surfaces 14, 16, 18 of the zeolite crystals 12, especially those formed on and over juxtaposed surfaces 16, 18 of adjacent zeolite crystals 12 or defects in crystals 12 reduce the effective sizes of the separations or spaces 22 between crystals 12 or defects in crystals 12 to an extent that improves very substantially selectivity between species and the ability of the zeolite crystals to block transport of larger molecules, thus improving molecular separation or sieving capabilities of the zeolite crystals 12 and of membranes made of such zeolite crystals 12. One monomolecular layer deposited as described above may also have some of the resulting O—M—OH or O—M—O groups formed around and over pore openings 24 in the crystals 12. In general, as described above, one such monomolecular layer will not substantially inhibit entry or transport of the smallest gas molecules, such as nitrogen, helium, or hydrogen into the pore openings 24 and through the pores 26, although larger gas molecules could be inhibited by such structures.

Since the resulting monomolecular layer 20 after the sequence of reaction (1) or (2) followed by reaction (3) or (4), as described above, leave hydroxyl (OH) sites 46, as illustrated in FIGS. 4, 8, and 9, the same sequence of reaction (1) or (2) followed by reaction (3) or (4) can be repeated to deposit an additional atomic level layer (not shown) of the same resulting material, which will reduce even further the effective pore openings 24 and separation or gaps 22 between juxtaposed surfaces 16, 18. This sequence of reactions can be repeated as often as desired to obtain the zeolite adsorption and sieving characteristics desired. However, it has been found that one of such sequences to produce one monomolecular layer 20 as described above is sufficient and preferred for general gas separation purposes and that an additional sequence of these reactions to deposit another layer can block the effective pore openings 24 too much for practical usage, even for small gas molecules.

It is emphasized again that while the above description and associated illustrations are explained mostly in terms of relative sizes of pores, defects, and molecules, which is useful for visualization and could even be quite accurate, it is not really known for sure whether size, shape, polarizibility, adsorption properties, or some combination of these or other characteristics are really affecting the selective permeability of the membranes. Therefore, the process of this invention, which does modify the permeability of the membranes, might be causing modifications in any one or combination of these factors.

EXAMPLES

Membrane Preparation and Characterization

Silicalite (zeolite) layers were synthesized hydrothermally from a gel in much the same manner as described by Flanigen et al., "Silicalite, a new hydrophobic crystalline silica molecular sieve," *Nature,* 1978 271, 512, on the inside of commercially-available porous $\gamma$-$Al_2O_3$ tubes (US Filters, 5-nm pores). After two synthesis steps, the membranes were washed, dried, and calcined at 733 K. The detailed synthesis procedure for the silicalite is described by Funke et al. 1995, *Ind. Eng. Chem. Res.* 1996, Vol. 35, page 1575, and Jia et al. 1994, supra. The membranes were characterized by pure gas permeation at room temperature and 150 kPa pressure difference between feed and permeate side. Gases with different molecular sizes were used as probes. Sulfur hexafluoride ($SF_6$) has a kinetic diameter of 0.55 nm, which is close to the pore size of silicalite and hardly passes the zeolite pores, whereas small molecules such as He, $N_2$, $H_2$, or $CH_4$ readily permeate through silicalite pores. The pure gas permeance for $N_2$ (kinetic diameter of 0.36 nm) and $SF_6$ and the pure gas permeance ratios of the unmodified membranes are listed as the first row in Tables 1 and 2 below.

Atomic Layer Controlled Chemical Vapor Deposition (ALC-CVD)

The ALC-CVD depositions were performed in a standard high vacuum setup with a dosing device to adjust the partial pressure of precursors in the system. The modification of the zeolite membranes required four treatment steps. First, an effort was made to remove surface water from the membrane layer so that the $Al(CH_3)_3$ would only react with surface OH-groups. Heating to 523 K at $10^{-4}$ torr for several hours was thought to be sufficient for silicalite membranes, but it was not possible to know for sure that all of the surface water was actually removed. Because the deposition reaction is sensitive to adsorbed organic compounds a cleaning step removed adsorbed hydrocarbons. Treatment for 2 min. with $H_2O$ plasma at 0.20 torr at room temperature prior to each deposition was sufficient to remove adsorbed molecules and allow the deposition. The plasma was created by an electrical discharge in the system. The dried and pretreated membranes were exposed to $Al(CH_3)_3$ for 10 min. at 5 torr and 500 K. The progress of the reaction can be monitored by analyzing the gas composition. At least one molecule of $CH_4$ is formed for each reacted $Al(CH_3)_3$. If the surface OH-density is high, one $Al(CH_3)_3$ molecule can react with more than one OH group, and more than one $CH_4$ molecule forms, as illustrated in FIG. 2, which effect was also shown by Dillon et al., "Surface chemistry of $Al_2O_3$ deposition using $Al(CH_3)_3$ and $H_2O$ in a binary reaction sequence," *Surface Science,* 1995, 211, 2330. The membranes were exposed to 5 torr of water vapor at 500 K to hydrolyze the unreacted Al—$CH_3$ bonds of the surface and form hydroxyl groups as shown in FIG. 3. The hydrolysis step can also be accomplished by exposing the membrane to ambient air that has some moisture content. The hydroxyl groups of adjacently deposited compounds in close proximity can cross-link by condensation to form a continuous, monomolecular $Al_2O_3$ layer as illustrated in FIG. 4.

Water Plasma Treatment

The influence of the water plasma treatment on the permeation properties of a zeolite membrane (HSil54) was determined by measuring $N_2$ and $SF_6$ permeances of membrane HSil54 before and after a plasma treatment. The pure gas permeances of $N_2$ and $SF_6$ at room temperature was $640 \times 10^{-9}$ moles/($m^2$s Pa) and $10.5 \times 10^{-9}$ moles/($m^2$s Pa) respectively for the untreated membrane with a permeance ratio of 61. The pure gas permeances did not change within experimental errors after the treatment ($650 \times 10^{-9}$ moles/($m^2$s pa) for $N_2$ and $11 \times 10^{-9}$ moles/($m^2$s Pa) for $SF_6$).

$Al_2O_3$-Layer Deposition

The changes of the single gas $N_2$ and $SF_6$ permeances through silicalite zeolite membranes induced by depositing atomic layers of $Al_2O_3$ are listed in Table 1 and 2. Six silicalite membranes with different initial permeation properties were characterized before and after the deposition of 1 and 2 layers of $Al_2O_3$. The $N_2$ permeances through membranes HSil50, HSil52, HSil54, and HSil56 decreased by 30–70% whereas the $SF_6$ permeance decreased by factors up to 17. Therefore, the pure gas permeance ratio for $N_2$ over $SF_6$ increased for those four membranes. Membrane HSil50 showed the best results with an increase in permeance ratio by a factor of more than five to over 560. The permeance ratio in the other three membranes increased by factors of two to three. A second layer deposited on HSil52 and HSil54 further decreased the $N_2$-permeance by factors of 10 to 40 whereas the $SF_6$ permeance only dropped a factor of 5 for HSil52 and slightly increased for HSil54. As a result permeance ratios dropped sharply for both membranes.

For two membranes (HSi51N and HSil53 in Table 2), a single ALC-CVD layer apparently was sufficient to block a large fraction of the zeolite pores so that the permeances for $N_2$ decreased by a factor of 6 and 20 respectively, but the $SF_6$ permeances changed less dramatically. The single gas permeance ratios therefore decreased for both membranes by a factor of 6.

Single compound permeances and selectivities of gases with different kinetic diameters through membrane HSil50 and some selected permeance ratios are listed in Table 3. The smallest molecules (He and $H_2$) permeated ~1500 and 2400 times faster than $SF_6$, the slowest molecule. Gases with similar kinetic diameters, such as $N_2$ and $CO_2$, permeated at similar rates.

The permeance of two fluorinated hydrocarbons ($CHF_2$—$CH_2F$, kinetic diameter ~0.49 nm and $CF_3$—$CH_3$, kinetic diameter ~0.51 nm) through HSil56 were measured to determine if the $Al_2O_3$ layer changed the size of the zeolite pore openings. These kinetic diameters are slightly smaller than the pore size silicalite. Table 4 indicates that both compounds permeated at similar rates and only a factor of 1–7 slower than $N_2$. Apparently, a sharp size cutoff between 0.55 and 0.51 nm results in permeance ratios of more than 100 between $CF_3$—$CH_3$ and $SF_6$.

DISCUSSION OF EXEMPLARY RESULTS

Zeolite membranes 10 can have defects or other non-zeolitic pores such as grain boundaries 22 between the crystals that are significantly larger than the zeolite pore openings 24 as indicated by relatively large permeances of molecules that should not be able to enter the zeolite pores 24 based on their molecule size. For example isooctane (kinetic diameter 0.62 nm, see Funke et al. 1996, supra), or m-and o-xylene (kinetic diameters ~0.68 nm, see C.D. Baertsch et al., Permeation of aromatic hydrocarbon vapor through silicalite-zeolite membranes," *J Phy. Chem.*, 1996, vol. 100, page 7676) should not be able to enter silicalite pores 24. Compounds with kinetic diameters close to the zeolite pore 24 size such as $SF_6$ should be highly hindered to enter the small zeolite pores 24. The experimentally observed fluxes of $SF_6$ therefore should be mainly attributed to grain boundaries 22 between the crystals or other non-zeolitic pores or defects. If the deposition closes or decreases the non-zeolite pores 22 that allow non-selective permeation, a strong decreases of the $SF_6$ permeance is expected. The extent to which each pathway contributes to the total $SF_6$ flux, however, is not known. The high $N_2/SF_6$ selectivity of 550 obtained for membrane HSil50 after one deposition suggests that for an ideal membrane 10 only a small $SF_6$ permeance is expected. It is noted that zeolites exhibit some flexibility in their pore structures, so molecules that are larger than the pore sizes determined by crystalography can be accommodated. See E. L. Wu, G. R. Landolt, and A. W. Chester, "Hydrocarbon adsorption characterization of high silica zeolites," *Studies in Surface Science and Catalysis*, 1986, vol. 28, page 547. Therefore, fraction of the permeance of the larger molecules can be due to diffusion through the zeolite pores.

The permeance for $N_2$ decreases more than expected if ALC-CVD only blocks the regions or gaps 22 between crystals 12 and $N_2$ and $SF_6$ have the same permeances in these pores. Apparently some $Al_2O_3$ overgrows the zeolite pores 24 which are the main pathway for $N_2$.

For two membranes (HSil51N, HSil53), one $Al_2O_3$ layer 20 was sufficient to block most of the zeolite pore openings 24, and both $N_2$ and $SF_6$ permeated at slow but similar rates. Apparently the deposited layer 20 did not seal all defects, which are not selective, but the layer 20 did seal zeolite pore openings 24. The density and location of hydroxyl groups on the zeolite surface may affect whether zeolite pores 24 are sealed. The properties of the initial membrane are not identical, as indicated in Table 1 and 2. Even membranes with similar separation properties do not necessarily have the same surface structures and density and location of surface OH-groups.

Growth of the ALC-CVD layer close to the pore openings 24 should also alter the effective size of the zeolite pores 26. If some $SF_6$ molecules permeate through silicalite pores 26, a small decrease in pore opening 24 size should be sufficient to totally exclude the $SF_6$ molecules from entering the zeolite pores 26. The observed permeance decrease therefore could also be partially attributed to a decrease in pore opening 24 size caused by $Al_2O_3$ close to the pore openings 24. The decrease cannot be too large, however, because the two CFC compounds, which are only slightly smaller than $SF_6$, permeated at rates close to $N_2$ as listed in Table 3. If the deposition decreased the zeolite pore openings 24 significantly, the CFC's should also be strongly excluded.

The CVD layer can also change the adsorption properties of the zeolite surface. Barrer, "Porous crystal membranes," *J. Chem. Soc. Faraday Trans.*, 1990, vol. 86, 1123, suggests that the first step for the transport through zeolite membranes is adsorption on the external membrane surface. A change in external adsorption properties can therefore significantly alter the overall transport rates without decreasing the pore sizes. The surface properties of $Al_2O_3$ are sufficiently different from those of the silica surface of silicalite to change adsorption behavior.

SUMMARY OF EXEMPLARY RESULTS

Atomic layer controlled chemical vapor deposition (ALC-CVD) of $Al(CH_3)_3$ was used to modify single gas permeances through silicalite zeolite membranes 10 by depositing layers 20 of $Al_2O_3$ on the membrane surface. The deposited layers 20 alter the membrane 10 properties probably by either closing defects in the membrane structure or changing the surface adsorption properties. The best improvement was a more than fivefold increase in the $N_2/SF_6$ pure compound permeance ratio to 550 with a three-fold decrease in $N_2$ permeance. The deposition apparently did not change the zeolite pore size 24 significantly. The deposition of additional layers closed the zeolite pore openings 24 and the permeance ratio decreased.

TABLE 1

| # of CVD layers | HSil50 P[N$_2$] | HSil50 P[SF$_6$] | HSil50 α | HSil52 P[N$_2$] | HSil52 P[SF$_6$] | HSil52 α | HSil54 P[N$_2$] | HSil54 P[SF$_6$] | HSil54 α | HSil56 P[N$_2$] | HSil56 P[SF$_6$] | HSil56 α |
|---|---|---|---|---|---|---|---|---|---|---|---|---|
| 0 | 990 | 9.9 | 100 | 915 | 22 | 42 | 650 | 11 | 62 | 860 | 8.8 | 98 |
| 1 | 320 | 0.58 | 550 | 441 | 4.4 | 100 | 485 | 3.5 | 139 | 530 | 2.8 | 188 |
| 2 |   |   |   | 13 | 0.7 | 19 | 41 | 6.7 | 6.1 |   |   |   |

TABLE 2

| # of CVD layers | HSil51N P[N$_2$] | HSil51N P[SF$_6$] | HSil51N α | HSil53 P[N$_2$] | HSil53 P[SF$_6$] | HSil53 α |
|---|---|---|---|---|---|---|
| 0 | 590 | 9.6 | 61 | 438 | 5.7 | 76 |
| 1 | 98 | 9.3 | 10.5 | 22 | 1.6 | 14 |

TABLE 3

| molecule | SF$_6$ | CH$_4$ | N$_2$ | CO$_2$ | H$_2$ | He |
|---|---|---|---|---|---|---|
| kinetic diameter (nm) | 0.55 | 0.38 | 0.36 | 0.33 | 0.29 | 0.26 |
| Permeance × 10$^9$ [moles/(m$^2$sPa)] | 0.58 | 440 | 320 | 280 | 1400 | 910 |
| selected permeance ratios | N$_2$/SF$_6$: 550 | CH$_4$/SF$_6$: 760 | H$_2$/N$_2$: 4.4 | N$_2$/CO$_2$: 1.15 | H$_{2/SF6}$: 2420 | He/SF$_6$: 1570 |

TABLE 4

| compound | N$_2$ | SF$_6$ | CHF$_2$—CH$_2$F | CF$_3$—CH$_3$ |
|---|---|---|---|---|
| kinetic diameter(nm) | 0.36 | 0.55 | 0.51 | 0.49 |
| Permeance × 10$^9$ [moles/(m$^2$sPa)] | 530 | 2.8 | 300 | 320 | it is not desired to limit the invention to the exact construction and process shown and described above. Accordingly, all suitable modifications and equivalents may be resorted to falling within the scope of the invention as defined by the claims which follow.

The embodiments of the invention in which an exclusive property or privilege is claimed are defined as follows:

1. A membrane comprising a molecular sieve membrane, wherein the molecular sieve contains SiO$_2$ values, said membrane having a surface and a monomolecular layer on said surface, said monomolecular layer comprising a plurality of coordinated molecular groups, said coordinated molecular groups comprising at least one metal atom (M) coordinated with at least one oxygen atom that is bonded to silicon (Si) atoms in the substrate and at least one hydroxyl (OH) group bonded to the metal atom (M).

2. The membrane of claim 1, wherein said metal atom M is an aluminum Al atom.

3. The membrane of claim 1, wherein said metal atom M is a silicon Si atom.

4. The membrane of claim 1, wherein said metal atom M is a germanium Ge atom.

5. The membrane of claim 1, wherein said metal atom M is a indium In atom.

6. The membrane of claim 1, wherein said metal atom M is a cadmium Cd atom.

7. A membrane, comprising:
   a crystalline substantially silicon dioxide (SiO$_2$) substrate with a surface; and
   a monomolecular layer deposited on said surface, said monomolecular layer comprising a plurality of coordinated molecular groups, said coordinated molecular groups comprising at least two metal atoms (M bonded to at least one common oxygen (O) atom and wherein each reactive atom (M) is also bonded to an oxygen (O) atom that is bonded to a silicon (Si) atom in the substrate.

8. The membrane of claim 7, wherein said metal atoms M are aluminum Al atoms.

9. The membrane of claim 8, wherein said metal atoms M are silicon Si atoms.

10. The membrane of claim 8, wherein said metal atoms M are germanium Ge atoms.

11. The membrane of claim 8, wherein said metal atoms M are indium In atoms.

12. The membrane of claim 8, wherein said metal atoms M are cadmium Cd atoms.

13. A molecular sieve membrane, wherein the molecular sieve contains SiO$_2$ values, said membrane having a surface membrane comprising a crystalline and a monomolecular layer on said surface, said monomolecular layer comprising a plurality of coordinated molecular groups, each of said coordinated molecular groups comprising a metal atom (M) coordinated with at least one oxygen atom (O*) that is bonded to an atom (Y) in the substrate and at least one hydroxyl (OH) group bonded to the metal atom (M), said membrane produced by the method comprising:

(a) exposing said surface of said substrate to a reaction gas molecule having the formula M(Z$_m$L$_n$), where M is a metal atom coordinated to ligand group Z$_m$L$_n$ comprising ligands Z and L, and allowing a solid/vapor phase chemical reaction to proceed generally as follows:

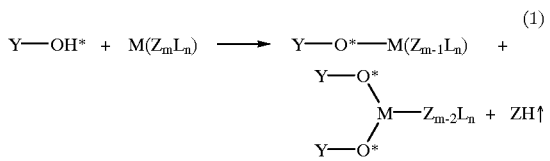

(1)

where:
   Y is a substrate atom;
   OH* is a surface hydroxyl group comprising oxygen O* bonded to hydrogen H*;

Y—O*—M($Z_{m-1}L_n$) and

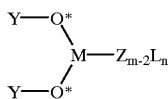

are bonded coordinated groups that result from reaction (1);

M($Z_{m-1}L_n$) is a resulting group comprising the coordinated metal atom (M) and ligand group $Z_{m-1}L_n$;

M($Z_{m-2}L_n$) is a resulting group comprising the coordinated metal atom (M) and ligand group $Z_{m-2}L_n$; and ZH↑ is a gaseous by-product of the reaction (1); and (b) exposing the bonded Y—O*—M($Z_{m-1}L_n$) and

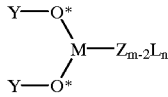

coordinated groups that result from reaction (1) to water ($H_2O$) molecules to hydrolyze M($Z_{m-1}L_n$) and M($Z_{m-2}L_n$) bonds according to a hydrolyzing reaction generally as follows:

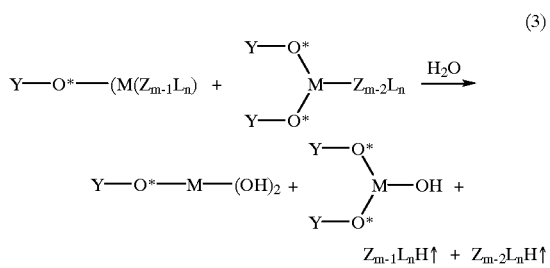

where:

Y is said substrate atom bonded to oxygen O*;

M—$(OH)_2$ and M—OH are resulting bonded groups comprising the metal atom M bonded to substrate bonded oxygen O* and coordinated with one or more hydroxyl groups (OH); and $Z_{m-1}L_n$H↑ and $Z_{m-2}L_n$H↑ are gaseous by-products of the hydrolyzing reaction (3).

14. The membrane of claim 13, wherein ligands L and Z in said ligand group $Z_mL_n$ are the same ligands.

15. The membrane of claim 13, wherein ligands L and Z in said ligand group $Z_mL_n$ are different ligands.

16. A membrane comprising a crystalline substantially silicon dioxide ($SiO_2$) substrate with a surface and a monomolecular layer on said surface, said monomolecular layer comprising a plurality of coordinated molecular groups, each of said coordinated molecular groups comprising at least one metal atom (M) coordinated with at least one oxygen atom (O*) that is bonded to an atom (Y) in the substrate and at least one hydroxyl (OH) group bonded to the metal atom (M), said membrane produced by the method comprising:

(a) exposing said surface of said substrate to a reaction gas molecule having the formula M($Z_mL_n$), where M is a metal atom coordinated to ligand group $Z_mL_n$ comprising ligands Z and L, and allowing a solid/vapor phase chemical reaction to proceed generally as follows:

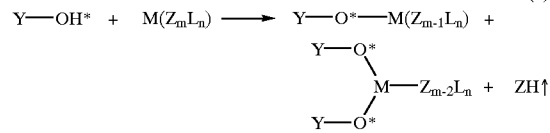

where:

Y is a substrate atom;

OH* is a surface hydroxyl group comprising oxygen O* bonded to hydrogen H*;

Y—O*—M($Z_{m-1}L_n$) and

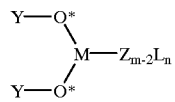

are bonded coordinated groups that result from reaction (1);

M($Z_{m-1}L_n$) is a resulting group comprising the coordinated metal atom (M) and ligand group $Z_{m-1}L_n$;

M($Z_{m-2}L_n$) is a resulting group comprising the coordinated metal atom (M) and ligand group $Z_{m-2}L_n$; and ZH↑ is a gaseous by-product of the reaction (1); and (b) exposing the bonded Y—O*—M($Z_{m-1}L_n$) and

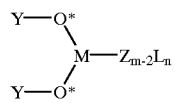

coordinated groups that result from reaction (1) to water ($H_2O$) molecules to hydrolyze M($Z_{m-1}L_n$) and M($Z_{m-2}L_n$) bonds according to a hydrolyzing reaction generally as follows:

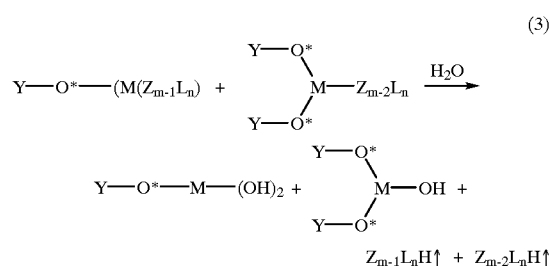

where:

Y is said substrate atom bonded to oxygen O*;

M—$(OH)_2$ and M—OH are resulting bonded groups comprising the metal atom M bonded to substrate bonded oxygen O* and coordinated with one or more hydroxyl groups (OH);

and $Z_{m-1}L_n$H↑ and $Z_{m-2}L_n$H↑ are gaseous by-products of the hydrolyzing reaction (3); and (c) allowing a condensation to occur between an OH group on one metal (M) and an OH group on an adjacent metal (M) to form at least one O—M—O bond.

17. The membrane of claim 16, wherein ligands L and Z in said ligand group $Z_mL_n$ are the same ligands.

18. The membrane of claim 16, wherein ligands L and Z in said ligand group $Z_mL_n$ are different ligands.

* * * * *